(12) United States Patent
Shiga

(10) Patent No.: US 8,331,158 B2
(45) Date of Patent: Dec. 11, 2012

(54) SEMICONDUCTOR MEMORY DEVICE

(75) Inventor: Hitoshi Shiga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 73 days.

(21) Appl. No.: 13/016,286

(22) Filed: Jan. 28, 2011

(65) Prior Publication Data
US 2011/0205801 A1   Aug. 25, 2011

(30) Foreign Application Priority Data
Feb. 25, 2010   (JP) ................. 2010-039898

(51) Int. Cl.
*G11C 11/34* (2006.01)
*G11C 16/04* (2006.01)
*G11C 16/06* (2006.01)
*G11C 5/14* (2006.01)

(52) U.S. Cl. ......... 365/185.18; 365/185.23; 365/189.09; 365/189.16

(58) Field of Classification Search ............. 365/185.18, 365/185.23, 189.09, 189.16
See application file for complete search history.

(56) References Cited

U.S. PATENT DOCUMENTS

| | | | |
|---|---|---|---|
| 6,542,411 B2 * | 4/2003 | Tanikawa et al. | 365/185.33 |
| 7,701,784 B2 | 4/2010 | Maejima et al. | |
| 2002/0048193 A1 * | 4/2002 | Tanikawa et al. | 365/185.33 |
| 2011/0286271 A1 * | 11/2011 | Chen | 365/185.09 |

FOREIGN PATENT DOCUMENTS

| | | |
|---|---|---|
| JP | 10-247386 | 9/1998 |
| JP | 2002-203396 | 7/2002 |
| JP | 2005-243152 | 9/2005 |
| JP | 2009-117018 | 5/2009 |

OTHER PUBLICATIONS

Office Action (with English translation) issued on Jul. 3, 2012, in counterpart Japanese Application No. 2010-039898 (4 pages).

* cited by examiner

*Primary Examiner* — Ly D Pham
(74) *Attorney, Agent, or Firm* — Oblon, Spivak, McClelland, Maier & Neustadt, L.L.P.

(57) ABSTRACT

In writing operation, charge pumps of a memory apply any of first to n-th voltages which are different from each other. An application-voltage selector selects voltages to be applied to WLs among the first to n-th voltages. A word-line number register stores the number of WLs to which each of the first to n-th voltages is to be applied for the first to n-th voltages. A storage stores a correspondence table that stores a relationship between the number of WLs for each of the first to n-th voltages and the number of charge pumps allocated to the first to n-th voltages. A generation-voltage selector allocates charge pumps to generate the first to n-th voltages based on the correspondence table according to the number of WLs for each of the first to n-th voltages. Each charge pump generates any of the first to n-th voltages allocated by the generation-voltage selector.

17 Claims, 7 Drawing Sheets

SEMICONDUCTOR MEMORY DEVICE

CROSS REFERENCE TO RELATED APPLICATIONS

This application is based upon and claims the benefit of priority from the prior Japanese Patent Application No. 2010-39898, filed on Feb. 25, 2010, the entire contents of which are incorporated herein by reference.

FIELD

The embodiments of the present invention relate to a semiconductor memory device.

BACKGROUND

In a nonvolatile semiconductor memory device such as a NAND flash memory, downscaling and multi-valuing of memory cells are developed. When both memory cells are downscaled and memory cells store multi-valued data or either memory cells are downscaled or memory cells store multi-valued data, the number of kinds of voltages applied to word lines at a data write time increases to three or more. For example, conventionally, at a data write time, mutually different voltages are also applied to selected word lines and unselected word lines, respectively. However, in recent years, it is also considered to make a voltage of an unselected word line close to a selected word line and a voltage of an unselected word line separated from a selected word line different from each other. Further, it is also considered to make a voltage of an unselected word line at a side nearer to a source than to a selected word line and a voltage of an unselected word line at a side nearer to a bit line than to a selected word line different from each other. Therefore, the number of kinds of voltages applied to word lines increases to three or more.

When the number of kinds of voltages applied to word lines increases as described above, the number of word lines to which voltages are applied varies depending on a position of a selected word line. Varying the number of word lines to which voltages are applied means that a word line capacitance boosting to each voltage changes. Therefore, the time required for a charge pump to boost a voltage of a word line to each voltage varies depending on a write address. When a rise time of word lines varies in each write operation, electric properties (a threshold voltage, for example) of memory cells after a writing change depending on addresses. Fluctuations of electric properties of memory cells become disadvantageous particularly for multi-valued memory cells.

Further, when a drive capacity of a charge pump matches a maximum capacitance of a word line for each voltage, there is a risk that a voltage of the word line oscillates when a load of the charge pump is a minimum capacitance of the word line. This risk occurs because the charge pump cannot converge the voltage of the word line to a constant voltage when a boost capacity (a current drive capacity) of the charge pump is larger than a capacitance (a load) of the word line.

Furthermore, when a drive capacity of a charge pump is matched with a maximum capacitance of a word line for each voltage, a layout area of the charge pump becomes larger, and this is disadvantageous to downscaling of memory chips.

DETAILED DESCRIPTION

A semiconductor memory device according to embodiments of the present invention includes plural memory cells. Plural word lines are connected to the plural memory cells. In writing data into at least one memory cell, plural charge pumps apply any of first to n-th voltages (n is an integer equal to or larger than 2) of which voltage levels are different from each other. An application-voltage selector then selects voltages to be applied to plural word lines among the first to n-th voltages. A word-line number register stores the number of word lines to which each of the first to n-th voltages is to be applied for the first to n-th voltages. A storage stores a correspondence table that stores a relationship between the number of word lines for each of the first to n-th voltages and the number of charge pumps allocated to the first to n-th voltages. A generation-voltage selector allocates plural charge pumps to generate the first to n-th voltages based on the correspondence table according to the number of word lines for each of the first to n-th voltages. Each charge pump generates any of the first to n-th voltages allocated by the generation-voltage selector.

Embodiments will now be explained with reference to the accompanying drawings.

(First Embodiment)

Figure 1:
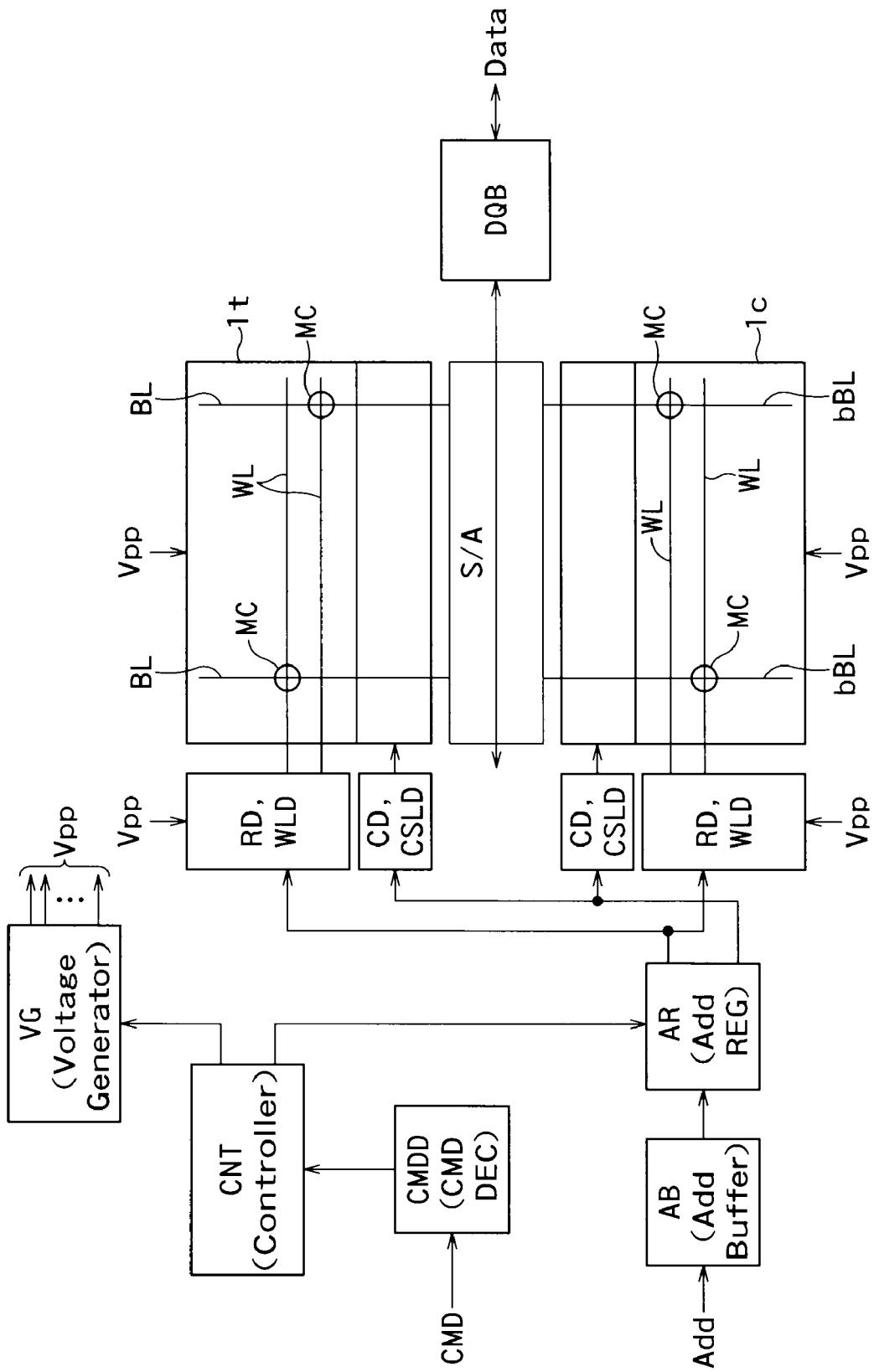
FIG. 1 is a block diagram showing a configuration of a NAND flash memory according to a first embodiment.

FIG. 1 is a block diagram showing a configuration of a NAND flash memory according to a first embodiment of the present invention. Two memory cell arrays 1$t$ and 1$c$ are arranged at both sides of a sense amplifier S/A, thereby sharing the sense amplifier S/A. Each of the memory cell arrays 1$t$ and 1$c$ includes plural memory cells MC two-dimensionally arranged in a matrix shape. Each memory cell MC is a multi-valued memory cell capable of storing multi-level data (data of two or more bits).

Plural word lines WL are extended to a row direction, and are connected to gates of memory cells MC or function as gates of the memory cells MC. Plural bit lines BL and bBL are extended to a column direction, and are connected to sources or drains of the memory cells MC. The bit lines BL and bBL form pairs, and each pair of bit lines are provided at left and right sides (or upper and lower sides) of the sense amplifier S/A. The word lines WL are orthogonal with the bit lines BL and bBL, and memory cells MC are provided at intersections of these lines. These cells are called cross-point cells. The row-direction and the column direction are names of convenience, and the row-direction and the column direction can be replaced with each other.

A pair of bit lines BL are extended to both sides of the sense amplifier S/A, and form an open bit-line structure. However, in the first embodiment, other bit-line structures (for example, a folded bit-line structure) can be used instead of the open bit-line structure.

A row decoder RD decodes a row address to select a specific word line among plural word lines WL. A word line driver WLD applies a voltage to a selected word line, thereby activating the selected word line.

A column decoder CD decodes a column address to select a bit line BL of a specific column among plural columns. A column-selection-line driver CSLD controls a column gate CGT to apply a potential to a selected column selection line, thereby reading data from the sense amplifier S/A to a DQ buffer DQB or writing data of the DQ buffer DQB into the sense amplifier S/A. The sense amplifier S/A can read data to outside of the memory via the DQ buffer DQB. The sense amplifier S/A can also write data from outside into a memory cell via the DQ buffer DQB.

An address signal Add is held in an address register AR via an address buffer AB, and is supplied to the row decoder RD and the column decoder CD.

A command CMD determining an operation mode of the memory is supplied from outside of a chip, and is then decoded by a command decoder CMDD, and is supplied to a controller CNT. The controller CNT performs a sequence control of data reading, data writing, and data erasing.

To apply various voltages to a bit line BL and a word line WL according to an operation mode, the row decoder RD, the word line driver WLD, the column decoder CD, and the column-selection-line driver CSLD require various voltages Vpp. The voltages Vpp include a write voltage Vpgm, a pass voltage Vpass, a verify voltage Vvf, a read voltage Vread, and a ground voltage GND. The pass voltage Vpass applied to an unselected word line at a data write time sometimes includes plural kinds of voltages Vpass1, Vpass2 and the like, following downscaling and multi-valuing of memory cells as described above. A voltage generating circuit VG is provided to generate these various voltages. The voltage generating circuit VG is also controlled by the controller CNT.

Figure 2:
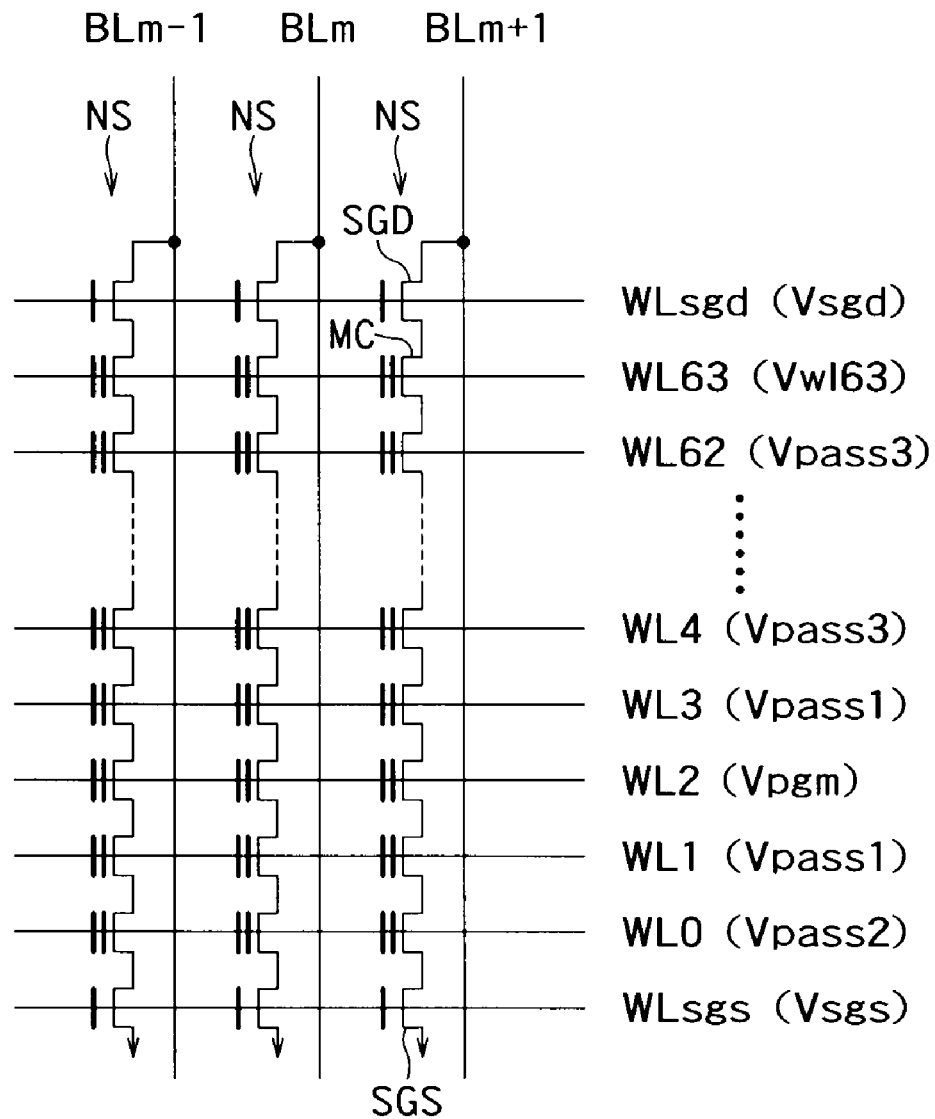
FIG. 2 is a conceptual diagram of a memory cell array in writing data into memory cells of a word line WL2.

FIG. 2 is a conceptual diagram of a memory cell array in writing data into memory cells of a word line WL2. A NAND flash memory includes plural NAND strings NS configured by plural memory cells MC connected in series. Each NAND string NS is connected to any one of bit lines BL via a drain-side selection gate SGD, and is connected to a source potential via a source-side selection gate SGS. A control gate of a memory cell MC is connected to any one of word lines WL.

FIG. 2 shows 64 word lines WL0 to WL63. FIG. 2 also shows word lines WLsgd and WLsgs connected to gate electrodes of the drain-side selection gate SGD and the source-side selection gate SGS, respectively. Reference characters within parentheses denote voltages applied to word lines at a data write time.

A program voltage Vpgm is applied to the word line WL2 selected. The pass voltage Vpass1 is applied to unselected word lines WL1 and WL3 adjacent to the selected word line WL2. A pass voltage Vpass3 is applied to unselected word lines WL4 to WL62 not adjacent to the selected word line WL2, and at a drain side (a bit line side) of the selected word line WL2. The pass voltage Vpass2 is applied to an unselected word line WL0 not adjacent to the selected word line WL2, and at a source side of the selected word line WL2. A voltage Vwl63 is applied to an unselected word line WL63 nearest to the word line WLsgd at a drain side. For example, the voltage Vwl63 does not need to be boosted.

The number of word lines to which the voltage Vpass3 is applied and the number of word lines to which the voltage Vpass2 is applied change greatly depending on a position (an address) of a selected word line. For example, when the word line WL2 is selected at a write time, the voltage Vpass2 is applied to only the word line WL0, and the voltage Vpass3 is applied to 58 word lines including WL4 to WL62. When the word line WL30 is a selected word line, the voltage Vpass2 is applied to 29 word lines including the word lines WL0 to WL28, and the voltage Vpass3 is applied to 30 word lines including WL32 to WL62. In this way, a load capacitance of each voltage changes greatly depending on a position (an address) of a selected word line. Along with this change, a current drive capacity of a charge pump necessary to boost a voltage to each level also changes greatly depending on an address of a selected word line. This voltage application method is only an example. The method of applying a voltage to a word line WL is not limited to this example, and other application methods can be also used.

The program voltage Vpgm is higher than the pass voltages Vpass1 to Vpass3. For example, in writing data "0", that is, in increasing a threshold voltage of a memory cell MC, a ground potential is applied to a bit line connected to a selected memory cell. With this arrangement, electrons are injected to a floating gate by a potential difference between the voltage Vpgm of the selected word line WL2 and a potential (GND) of a channel of the memory cell MC.

In maintaining data "1", that is, in holding a threshold voltage in an erase state, a bit line connected to a selected memory cell MC is charged at a voltage Vdd higher than a ground potential, and thereafter, Vpgm and Vpass are applied to a word line. When Vpgm and Vpass are applied to the word line, a channel part of a selected memory cell MC is set in a floating state. Therefore, a potential of a channel part of a selected memory cell MC comes close to Vpass from Vdd by a capacitance coupling between the word line and the channel part of the memory cell. As a result, a potential difference between a selected word line and the channel part of the selected memory cell becomes relatively small, and electrons are not injected to a floating gate of the selected memory cell. Consequently, the erase state of the memory cell MC is maintained, and the threshold voltage of the memory cell MC does not fluctuate.

At this time, when the pass voltages Vpass1 to Vpass3 are higher, a capacitance coupling between a bit line and a memory cell MC becomes larger, and this is preferable. On the other hand, when pass voltages Vpass1 to Vpass3 are too high, there is a risk that data is erroneously written into an unselected memory cell due to a potential difference between Vpass of an unselected word line and a channel part. Therefore, from a viewpoint of reliability of the memory, it is preferable that the pass voltages Vpass1 to Vpass3 are finely-adjusted.

Figure 3:
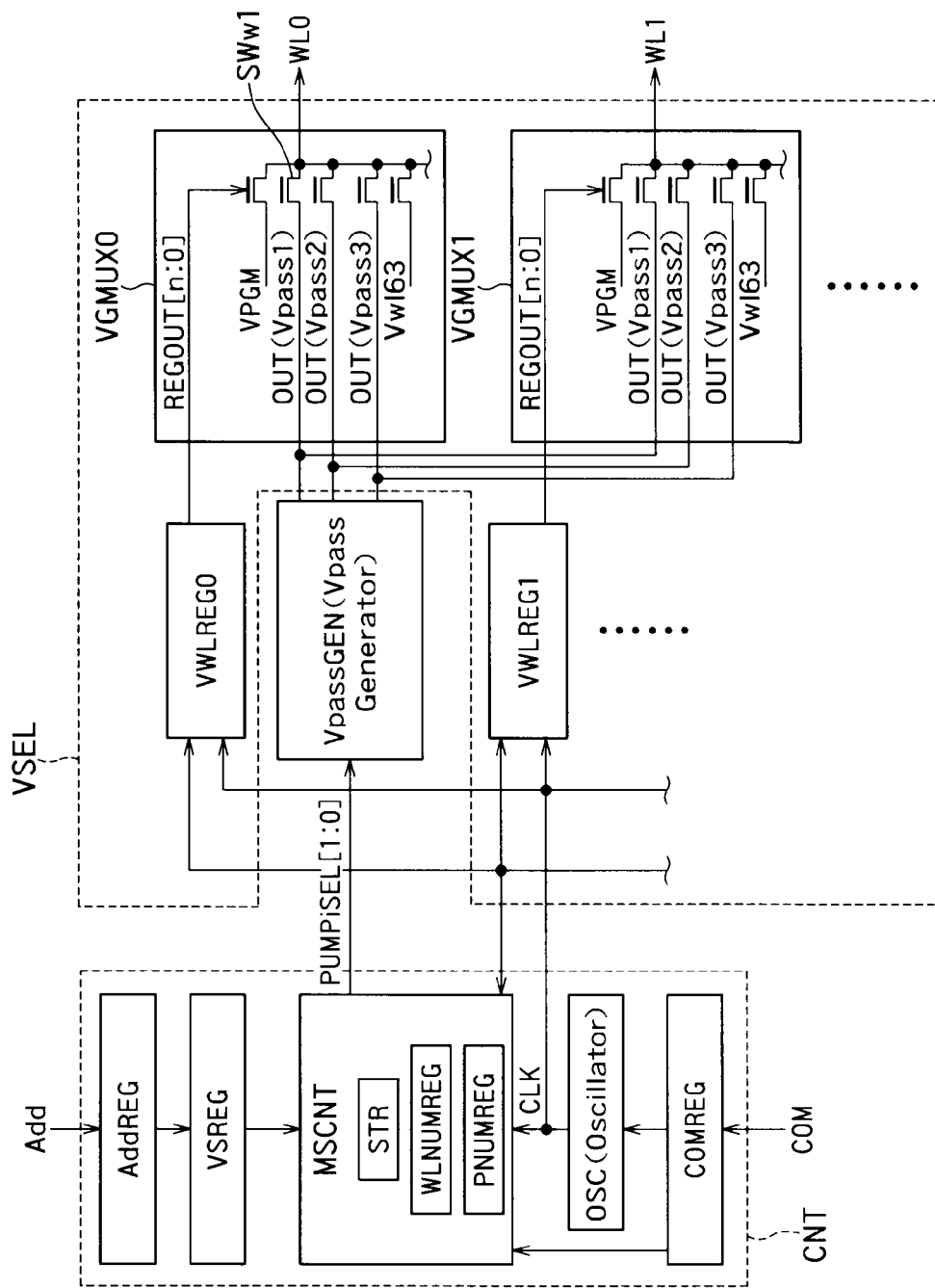
FIG. 3 is a block diagram showing a configuration of the voltage generating circuit VG generating voltages of various word lines WL.

FIG. 3 is a block diagram showing a configuration of the voltage generating circuit VG generating voltages of various word lines WL. The voltage generating circuit VG includes: an application-voltage selecting circuit VSEL selecting a voltage to be applied to word lines WLi (i is an integer of 0 to 63) from plural voltages Vpgm, Vpass1 to Vpass3, Vwl63 or the like; a Vpass generating circuit VpassGEN; and the controller CNT controlling the application-voltage selecting circuit VSEL and the Vpass generating circuit VpassGEN or the like.

The application-voltage selecting circuit VSEL includes gate-voltage multiplexers VGMUXi, and word-voltage registers VWLREGi. The gate-voltage multiplexers VGMUXi are provided corresponding to word lines WLi, and have plural switches SWwI connected between corresponding word lines and various voltages. Accordingly, each gate-voltage multiplexer VGMUXi can selectively apply any of plural voltages to corresponding word line WLi. The word-voltage registers VWLREGi are provided corresponding to the word lines WLi and the gate-voltage multiplexers VGMUXi, and hold information of voltages selected by gate-voltage multiplexers VGMUX0 to VGMUM63, respectively. The word-voltage registers VWLREGi output a signal REGOUT following this voltage information to the gate-voltage multiplexers VGMUXi.

Each gate-voltage multiplexer VGMUXi sets any of the switches SWwl to an on state by the signal REGOUT, thereby being able to apply a voltage set by a voltage setting register VSREG to the word line WLi.

The Vpass generating circuit VpassGEN is configured to generate the pass voltages Vpass1 to Vpass3 and supply the pass voltages Vpass1 to Vpass3 each gate-voltage multiplexer VGMUXi. Detailed configurations of the Vpass generating circuit VpassGEN are described later with reference to FIG. 4.

The controller CNT controls the voltage generating circuit VG and the Vpass generating circuit VpassGEN, upon receiving the address Add and the command COM. The controller CNT can be the controller CNT shown in FIG. 1 or can be provided separately from the controller CNT shown in FIG. 1. The controller CNT includes an address register AddREG, a voltage setting register VSREG, a memory sequence controller MSCNT, an oscillator OSC, and a command register COMREG.

The address register AddREG stores the address signal Add received from outside at a data write time. The address register AddREG can be integrated with the address register AR shown in FIG. 1 or can be separately provided. The voltage setting register VSREG sets a plurality of voltage values to be applied to a selected word line to which data is to be written according to an address Add and other unselected word lines, and holds this voltage information. For example, the voltage setting register VSREG sets a voltage to be applied to the selected word line WL2 at Vpgm, sets a voltage to be applied to the unselected word lines WL1 and WL3 at Vpass1, sets a voltage to be applied to the unselected word line WL0 at Vpass2, sets a voltage to be applied to the unselected word lines WL3 to WL62 at Vpass3, and sets a voltage to be applied to the word line WL63 at Vwl63.

The command register COMREG receives from outside a command of an operation concerning writing, reading, or erasing, and holds this command. The oscillator OSC generates a clock CLK synchronizing operations of elements of the memory sequence controller MSCNT and the like.

The memory sequence controller MSCNT includes a word-line-number register WLNUMREG, a charge-pump-number register PNUMREG, and a storage STR. The memory sequence controller MSCNT counts the number of word lines to which each of the pass voltages Vpass1 to Vpass3 is applied. The word-line-number register WLNUMREG stores the number of word lines that the memory sequence controller MSCNT counts for each of the pass voltages Vpass1 to Vpass3. The storage STR stores a correspondence table showing a relationship between the number of word lines for each of the pass voltages Vpass1 to Vpass3 and the number of charge pumps (see FIG. 4) allocated to the pass voltages Vpass1 to Vpass3. The correspondence table can be performed by a combination circuit. The charge-pump-number register PNUMREG is provided to count the number of charge pumps allocated to each of the pass voltages Vpass1 to Vpass3.

The number of word lines for each of the pass voltages Vpass1 to Vpass3 becomes clear when the memory sequence controller MSCNT counts information of each voltage stored in each word-voltage register VWLREGi. For example, in an example shown in FIG. 2, the number of word lines applied with the voltage Vpass1 is two, the number of word lines applied with the voltage Vpass2 is one, and the number of word lines applied with the voltage Vpass3 is 58. The correspondence table is generated by considering a drive capacity of a charge pump and a capacitance of a word line, and is stored in the storage STR in advance.

In the first embodiment, charge pumps PUMPj have equal current-drive capacities. In this case, a drive capacity of a word line can be managed by the number of the charge pumps PUMPj. Therefore, charge pumps can be allocated easily. It is sufficient that charge pumps are allocated to generate the voltages Vpass1 to Vpass3 by the number of word lines of each of the pass voltages Vpass1 to Vpass3, for example. More specifically, the number of charge pumps allocated to the pass voltages Vpass1 to Vpass3 can be proportional to the number of word lines of the pass voltages Vpass1 to Vpass3, respectively. With this arrangement, the correspondence table becomes in a simple structure, and a capacitance of the correspondence table can be made small. Alternatively, the correspondence table can be realized by a simple combination circuit.

The memory sequence controller MSCNT stores the number of charge pumps corresponding to the number of word lines for each of the pass voltages Vpass1 to Vpass3, into the charge-pump-number register PNUMREG based on the correspondence table. The memory sequence controller MSCNT allocates charge pumps to any of the pass voltages Vpass1 to Vpass3 following the number of charge pumps stored in the charge-pump-number register PNUMREG. More specifically, the memory sequence controller MSCNT transmits a generation-voltage selection signal PUMPjSEL to the Vpass generating circuit VpassGEN to allocate plural charge pumps to generate the pass voltages Vpass1 to Vpass3, respectively. In the first embodiment, because drive capacities of the charge pumps PUMPj are equal, it is sufficient that the charge-pump-number register PNUMREG stores only information of the number of the charge pumps PUMPj without discriminating between these charge pumps.

Figure 4:
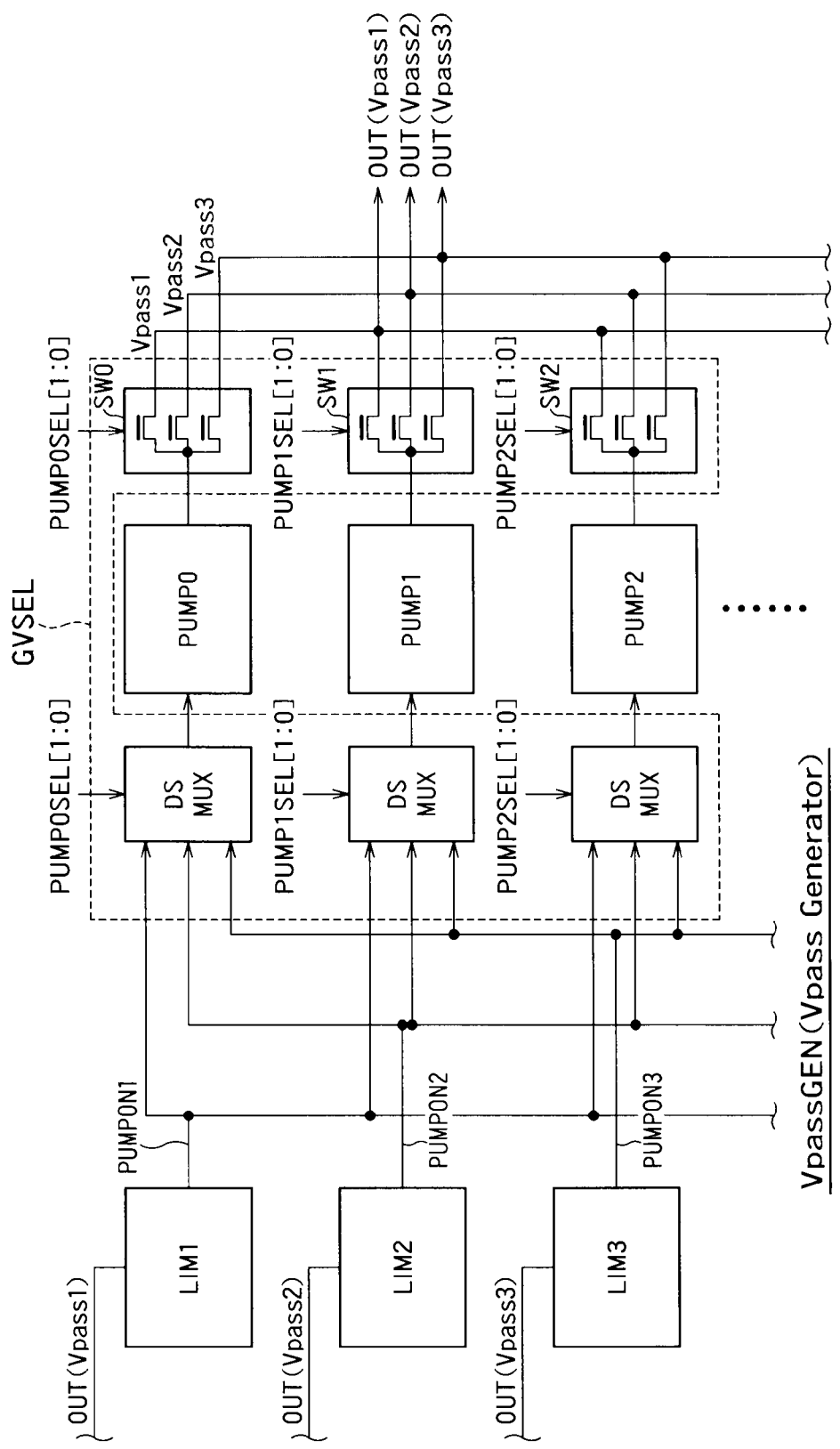
FIG. 4 is a block diagram showing a configuration of the Vpass generating circuit VpassGEN.

FIG. 4 is a block diagram showing a configuration of the Vpass generating circuit VpassGEN. The Vpass generating circuit VpassGEN includes limiters LIM1 to LIM3, a generation voltage selector GVSEL, and the charge pumps PUMPj. In this case, "j" is an integer larger than the number of kinds of pass voltages and smaller than the number of word lines. The total number of word lines and that of charge pumps do not necessarily match, and are determined by a capacitance of word lines and a drive capacity of charge pumps.

The limiters LIM1 to LIM3 are provided by the same number as that of kinds of the pass voltages Vpass1 to Vpass3. The limiters LIM1 to LIM3 transmit to the generation voltage selector GVSEL drive signals PUMPON1 to PUMPON3 determining boosted voltage levels of the plural charge pumps PUMPj at any of the pass voltages Vpass1 to Vpass3. More specifically, the limiters LIM1 to LIM3 receive feedbacks of output voltages OUT (Vpass1) to OUT (Vpass3) of the Vpass generating circuit VpassGEN, respectively, and on/off control the charge pumps PUMPj such that the output voltages OUT (Vpass1) to OUT (Vpass3) are converged to the pass voltages Vpass1 to Vpass3, respectively. For example, when the output voltage OUT (Vpass1) is smaller than the pass voltage Vpass1 by a threshold value or more, the limiter LIM1 activates the drive signal PUMPON1, and operates the charge pump PUMP1. On the other hand, when the output voltage OUT (Vpass1) is larger than the pass voltage Vpass1 by the threshold value or more, the limiter LIM1 inactivates the drive signal PUMPON1, and stops the charge pump PUMP1. With this arrangement, the output voltage OUT (Vpass1) is maintained such that this voltage is not deviated from the pass voltage Vpass1 by the threshold value or more.

The generation voltage selector GVSEL allocates plural charge pumps PUMPj to generate the pass voltages Vpass1 to Vpass3, respectively following the generation-voltage selection signal PUMPjSEL. That is, the generation voltage selector GVSEL allocates the charge pumps PUMPj of the number based on the correspondence table according to the number of word lines for each of the pass voltages Vpass1 to Vpass3.

The charge pumps PUMPj boost a power source voltage, and generate a voltage of any of the pass voltages Vpass1 to Vpass3 allocated by the generation voltage selector GVSEL.

The generation voltage selector GVSEL includes drive-signal selection multiplexers DSMUX and boosted-voltage transmission switches SWj. The drive-signal selection multiplexers DSMUX transmit the drive signals PUMPON1 to PUMPON3 corresponding to any of the pass voltages Vpass1 to Vpass3 to the charge pumps PUMPj based on the generation-voltage selection signal PUMPjSEL. The switches SWj transmit the pass voltages Vpass1 to Vpass3 output from the charge pumps PUMPj, to the application-voltage selecting circuit VSEL based on the signal PUMPjSEL. More specifically, the switches SWj switch a voltage to any of the pass voltages Vpass1 to Vpass3 based on the signal PUMPjSEL.

As explained above, the memory according to the first embodiment can allocate each of the plural charge pumps PUMPj to generate the pass voltages Vpass1 to Vpass3 following the number of the word lines WLi to be applied with the pass voltages Vpass1 to Vpass3. Accordingly, in the first embodiment, drive capacities of charge pumps can be matched to capacitances of word lines for the pass voltages Vpass1 to Vpass3. Consequently, redundant charge pumps can be omitted, and thus fluctuations of a rise time of word lines and electric properties of memory cells can be suppressed.

Because drive capacities of charge pumps are matched to capacitances of word lines, the memory according to the first embodiment can fine-adjust the pass voltages Vpass1 to Vpass3, and this is preferable from viewpoint of reliability.

The charge pumps PUMPj are allocated to each write sequence. One write sequence is configured by plural write operations and plural verify operations. In one write sequence, a write operation and a verify operation are repeatedly performed by stepping the voltage Vpgm of a selected word line until when the verify operation passes (until when data is written into a selected memory cell). When the verify operation passes (when data is written into a selected memory cell), one write sequence ends. An address of a selected word line and an address of an unselected word line do not change within one write sequence. Therefore, it is sufficient that the charge pumps PUMPj are allocated once in one write sequence in the first embodiment.

Figure 5:
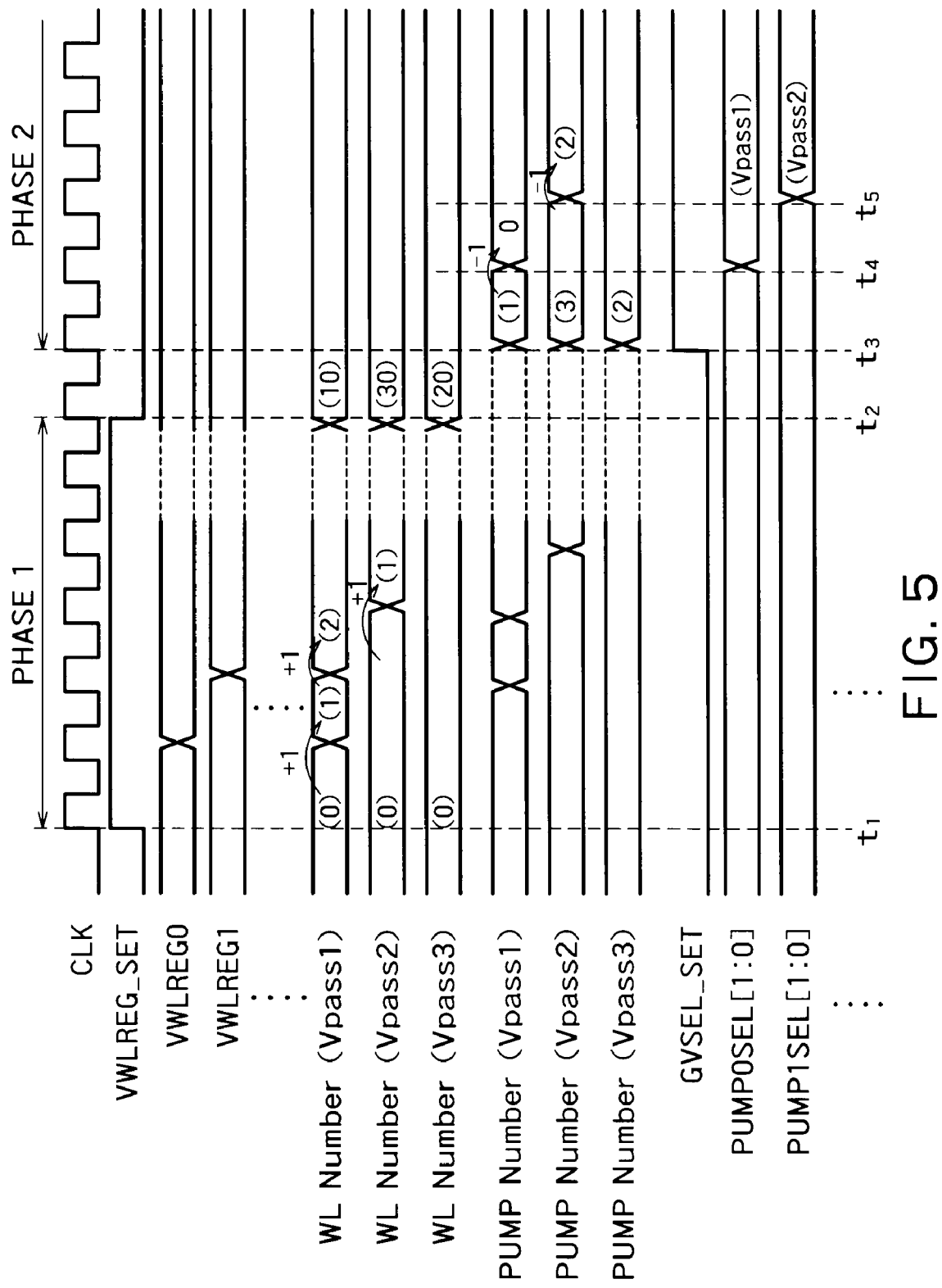
FIG. 5 is a timing chart showing an operation of the NAND flash memory according to the first embodiment.

FIG. 5 is a timing chart showing an operation of the NAND flash memory according to the first embodiment. The operation shown in FIG. 5 is an allocation operation of the charge pumps PUMPj performed at the start of each write sequence. Each element of the NAND flash memory operates based on a clock signal CLK as shown in FIG. 5.

In PHASE1, a voltage to be applied to each word line WLi is set, and the number of word lines to be applied with the pass voltages Vpass1 to Vpass3 is counted.

More specifically, at t1, a set signal VWLREG_SET is set in an active state to set the word-voltage registers VWLREGi shown in FIG. 3 in a settable state. Accordingly, respective word-voltage registers VWLREGi become settable.

The memory sequence controller MSCNT performs a setting of the word-voltage registers VWLREGi based on information of voltages to be applied to the word lines WLi stored in the voltage setting register VSREG. For example, in the example shown in FIG. 2, the memory sequence controller MSCNT sets a word-voltage register VWLREG0 such that the gate-voltage multiplexer VGMUX0 applies the voltage Vpass1 to the word line WL0, sets a word-voltage register VWLREG1 such that the gate-voltage multiplexer VGMUX1 applies the voltage Vpass1 to the word line WL1, and sets a word-voltage register VWLREG2 such that the gate-voltage multiplexer VGMUX2 applies the voltage Vpgm to the word line WL2. The memory sequence controller MSCNT also similarly sets other word-voltage registers VWLREG3 to VWLREG63.

The memory sequence controller MSCNT counts up the number of word lines of the pass voltages Vpass1 to Vpass3 stored in the word-line-number register WLNUMREG, simultaneously with a setting of the word-voltage registers VWLREGi. For example, in the example shown in FIG. 2, when the word-voltage register VWLREG0 is set to apply the pass voltage Vpass2 to the word line WL0, the memory sequence controller MSCNT increments by one the number of word lines of the pass voltage Vpass2, and stores an incremented number into the word-line-number register WLNUMREG. When the word-voltage register VWLREG1 is set to apply the pass voltage Vpass1 to the word line WL1, the memory sequence controller MSCNT increments by one the number of word lines of the pass voltage Vpass1, and stores an incremented number into the word-line-number register WLNUMREG. By repeating similar operations to all the word-voltage registers VWLREGi, the word-line-number register WLNUMREG can store the number of word lines to be applied to each of the pass voltages Vpass1 to Vpass3 by relating the number of word lines to each of the pass voltages Vpass1 to Vpass3. In the example shown in FIG. 5, the voltage Vpass1 is applied to ten word lines, the voltage Vpass2 is applied to 30 word lines, and the voltage Vpass3 is applied to 20 word lines.

The number of word lines for each of the pass voltages Vpass1 to Vpass3 is basically determined by an address Add determining a selected word line. Therefore, PHASE1 can be performed immediately after the address Add is input. Accordingly, a write sequence period can be shortened.

Next, in PHASE2, the memory sequence controller MSCNT refers to the correspondence table, and determines the number of the charge pumps PUMPj to be allocated to each of the pass voltages Vpass1 to Vpass3 based on the number of word lines corresponding to each of the pass voltages Vpass1 to Vpass3. The memory sequence controller MSCNT stores a determined number into the charge-pump-number register PNUMREG for each of the pass voltages Vpass1 to Vpass3. The charge-pump-number register PNUMREG can store the number of charge pumps generating each of the pass voltages Vpass1 to Vpass3, in relation to each of the pass voltages Vpass1 to Vpass3.

In the example shown in FIG. 5, the number of charge pumps is proportional to the number of word lines to be applied with each pass voltage. The number of a charge pump generating the voltage Vpass1 to be applied to ten word lines is one. The number of charge pumps generating the voltage Vpass2 to be applied to 30 word lines is three. The number of charge pumps generating the voltage Vpass3 to be applied to 20 word lines is two.

Each time when one charge pump is allocated to a certain voltage, the memory sequence controller MSCNT decrements by one the number of charge pumps corresponding to this voltage. When the number of charge pumps corresponding to all voltages stored in the charge-pump-number register PNUMREG becomes 0 (zero), an allocation work of the charge pumps PUMPj ends.

More specifically, at t3, a GVSEL setting signal GVSEL_SET is activated, and the generation voltage selector GVSEL becomes a settable state.

At t4, when a generation-voltage selection signal PUMP0SEL is set such that the charge pump PUMP0 generates the voltage Vpass1, the number of charge pumps corresponding to Vpass1 in the charge-pump-number register PNUMREG is decremented by one. As a result, the number of charge pumps corresponding to Vpass1 becomes 0. Consequently, the charge pump PUMP0 is allocated to generate the voltage Vpass1, and the allocation to generate the voltage Vpass1 ends.

Next, at t5, when a signal PUMP1SEL is set such that the charge pump PUMP1 generates the voltage Vpass2, the number of charge pumps corresponding to Vpass2 in the charge-pump-number register PNUMREG is decremented by one. As a result, the number of charge pumps corresponding to Vpass2 becomes two. Consequently, the charge pump PUMP1 is allocated to generate the voltage Vpass2. When the number of charge pumps corresponding to all the pass voltages Vpass1 to Vpass3 becomes 0 after repeating the allocation, an allocation work of the charge pumps PUMPj ends. As explained above, in the first embodiment, drive capacities of the charge pumps PUMPj are equal. Therefore, drive capacities of the charge pumps can be managed by the number of charge pumps.

The charge pumps PUMPj generate any of the pass voltages Vpass1 to Vpass3 to which the charge pumps are allocated. For example, the generation voltage selector GVSEL shown in FIG. 4 selectively transmits the drive signal PUMPON1 to the charge pump PUMP0 following the generation-voltage selection signal PUMP0SEL. The charge pump PUMP0 boosts a power source voltage to the voltage Vpass1 following the generation-voltage selection signal PUMP0SEL, and outputs the voltage Vpass1. A switch SW0 of the generation voltage selector GVSEL switches the voltage Vpass1 of the charge pump PUMP0 to output this voltage as OUT (Vpass1) following the generation-voltage selection signal PUMP0SEL.

Thereafter, a write operation and a verify operation are repeatedly performed by stepping up the voltage Vpgm of a selected word line. After writing into a selected memory cell ends, the charge pumps PUMPj are allocated again at a start time of the next write sequence.

As explained above, according to the first embodiment, in each write sequence, drive capacities of the charge pumps PUMPj can be matched to capacitances of word lines for each pass voltage. Therefore, according to the first embodiment, in a data write operation, fluctuations of a rise time of word lines and electric properties of memory cells can be suppressed.

According to the first embodiment, allocations of the charge pumps PUMPj to pass voltages can be changed in each write sequence. Therefore, because no redundant charge pumps are necessary to be provided, an increase of a layout area of charge pumps can be suppressed.

Conventionally, many charge pumps are necessary to be arranged for each pass voltage by considering a maximum word-line capacitance (a sum of capacitances of substantially all word lines WLi). For example, when the number of word lines is 64, charge pumps are set to be able to drive a capacitance of 64 times a capacitance Cwl (64×Cwl) of one word line. Further, charge pumps having a large drive capacity or many charge pumps need to be set for each of the pass voltages. Therefore, actually, when the number of word lines applied with a certain pass voltage is small depending on a position (an address) of a selected word line, redundant charge pumps are provided. Further, there is a possibility that a pass voltage oscillates because a drive capacity of a charge pump is too large for a capacitance of a word line.

On the other hand, according to the first embodiment, the number of charge pumps (that is, a drive capacity of a charge pump) is matched to a capacitance of a word line for each pass voltage in each write sequence. Therefore, according to the first embodiment, oscillation of the pass voltages Vpass1 to Vpass3 can be suppressed without increasing a layout area of the charge pumps.

(Second Embodiment)

According to the first embodiment, the charge pumps PUMPj have equal current-drive capacities. According to a second embodiment of the present invention, current drive capacities of the charge pumps PUMPj are different from each other. To differentiate the drive capacities of the charge pumps, it suffices that capacitances of capacitors (not shown) in charge pumps are changed.

In the example shown in FIG. 2, the number of a word line applied with the pass voltage Vpass1 is one when the word line WL0 becomes a selected word line. Generally, this number becomes two at most. Therefore, the number of word lines applied with the pass voltage Vpass1 does not change so much. On the other hand, the number of word lines applied with the pass voltage Vpass2 and the number of word lines applied with the pass voltage Vpass3 greatly vary depending on a position (an address) of a selected word line. The number of word lines applied with the pass voltage Vpass2 or the number of word lines applied with the pass voltage Vpass3 is very large as compared with the number of word lines applied with the pass voltage Vpass1. In the example shown in FIG. 2, any one of the pass voltages Vpass2 and Vpass3 is applied to 59 word lines WL. That is, in an actual write operation, the same pass voltage Vpass2 (or Vpass3) is applied to many word lines WLi. Therefore, the number of charge pumps can be reduced by providing charge pumps of a large drive capacity and charge pumps of a small drive capacity. For example, charge pumps of a small drive capacity can be used to generate the pass voltage Vpass1, and charge pumps of a large drive capacity can be used to generate both or either one of the pass voltages Vpass2 and Vpass3. By reducing the number of charge pumps in this way, the number of the drive-signal selection multiplexers DSMUX and the number of the switches SWj can be also reduced correspondingly. That is, by reducing the number of charge pumps, a configuration of the generation voltage selector GVSEL can be simplified.

Figure 6:
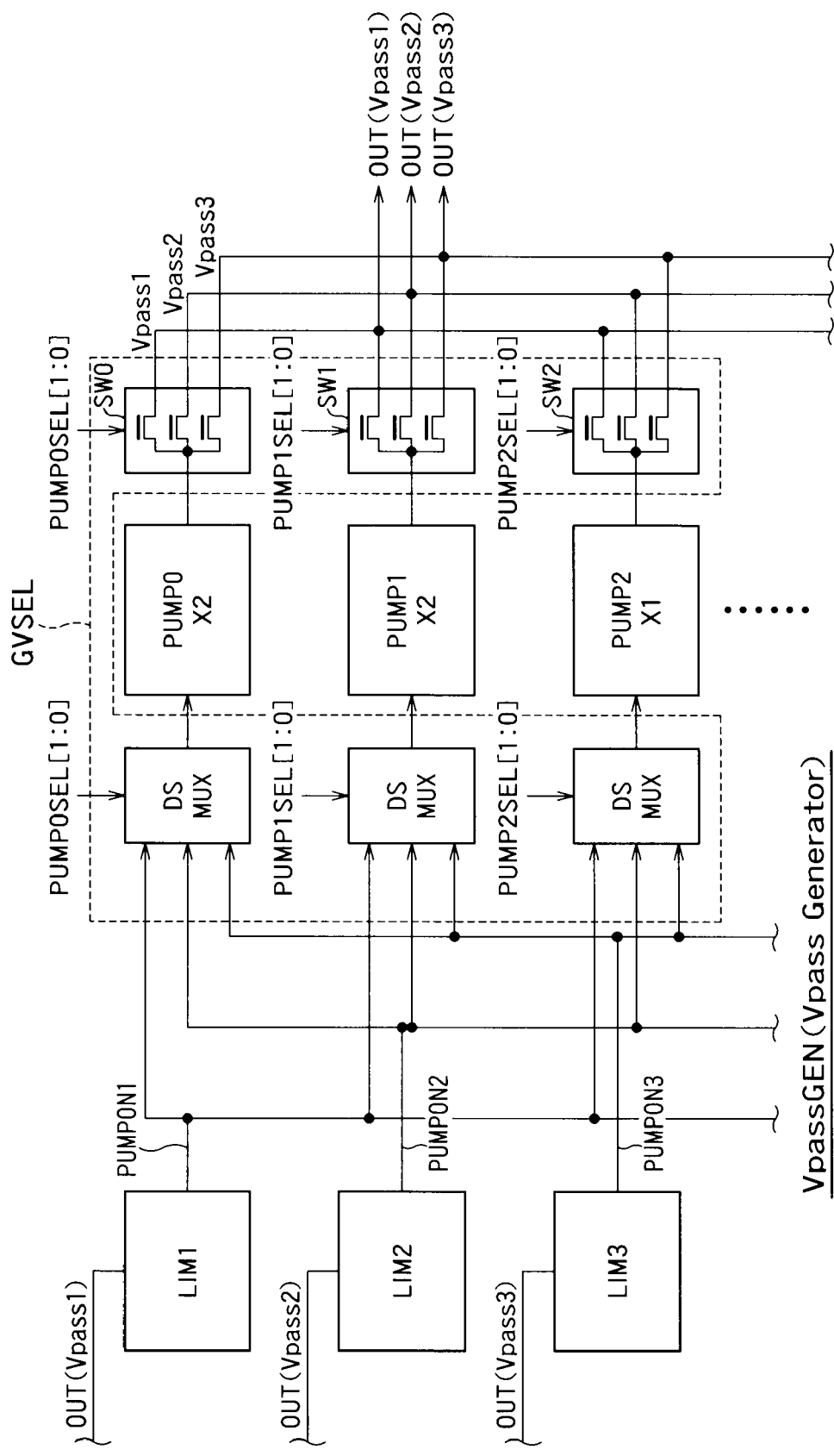
FIG. 6 is a block diagram showing a configuration of a Vpass generating circuit VpassGEN of the NAND flash memory according to the second embodiment.

FIG. 6 is a block diagram showing a configuration of a Vpass generating circuit VpassGEN of the NAND flash memory according to the second embodiment. The VpassGEN shown in FIG. 6 is different from that shown in drive capacities of the charge pumps PUMP9 and PUMP1. Other configurations of the VpassGEN shown in FIG. 6 can be identical to corresponding configurations of the VpassGEN shown in FIG. 4.

In FIG. 6, drive capacities of the charge pumps PUMP0 and PUMP1 are two times of the drive capacity of the charge pump PUMP2. Therefore, the charge pump PUMP2 can be used to generate the pass voltage Vpass1, and the charge pumps PUMP0 and PUMP1 can be used to generate both or either one of the pass voltages Vpass2 and Vpass3.

In this case, the charge-pump-number register PNUMREG stores not only information of the number of the charge pumps PUMPj but also information of drive capacities of the charge pumps PUMPj. For example, information of the drive capacity of the charge pump PUMP2 is set at "1", and information of the drive capacities of the charge pumps PUMP0 and PUMP1 is set at "2". The memory sequence controller MSCNT decrements the number of the charge pumps PUMPj based on the information of drive capacities of the charge pumps PUMPj at the time of allocating charge pumps of PHASE2.

Other configurations of the second embodiment can be identical to those of the first embodiment. Therefore, the second embodiment can also achieve effects identical to those of the first embodiment. In addition, the second embodiment can further reduce a chip area of a memory.

Figure 7:
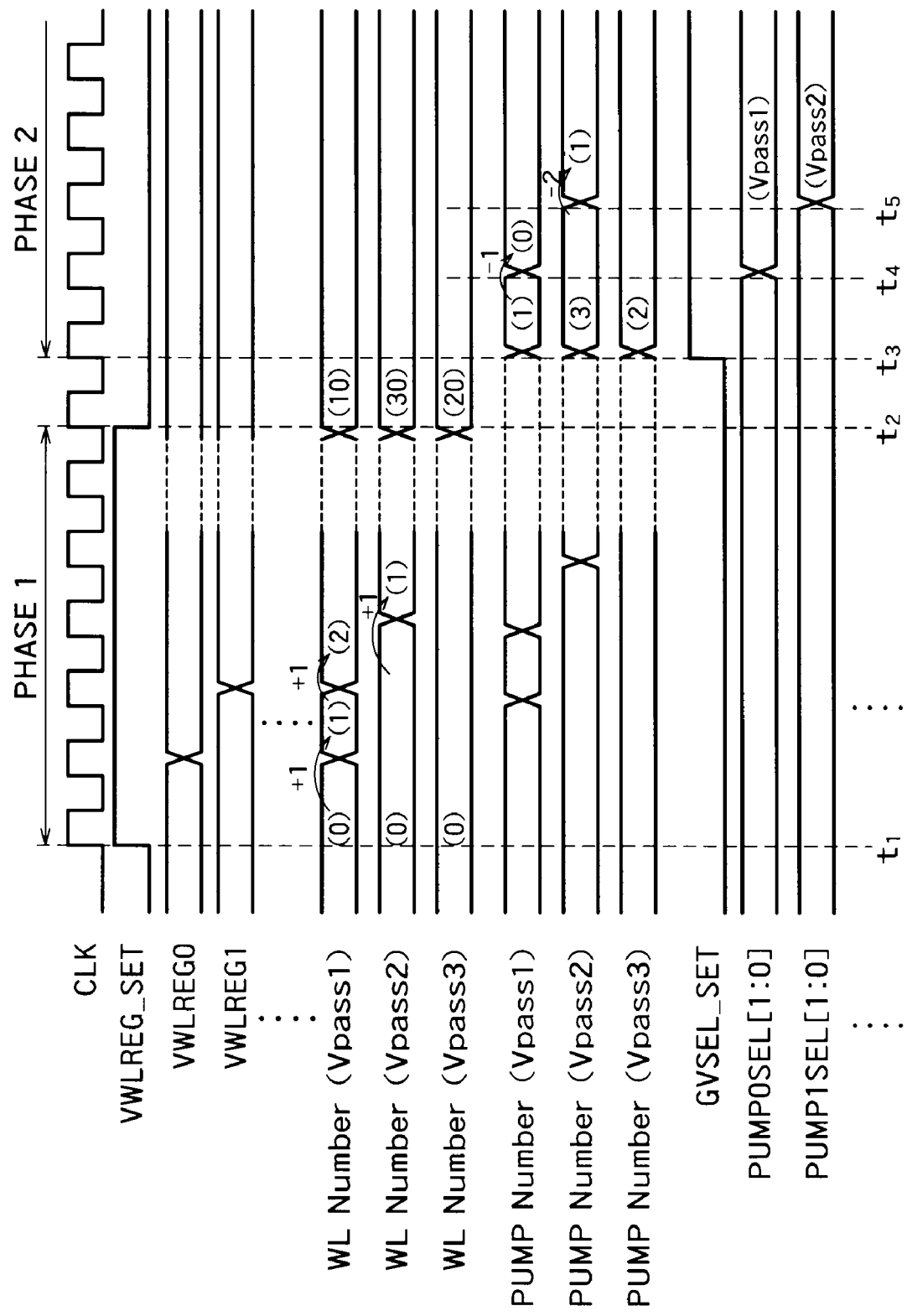
FIG. 7 is a timing chart showing an operation of the memory according to the second embodiment.

FIG. 7 is a timing chart showing an operation of the memory according to the second embodiment. The operation of the memory according to the second embodiment is basically identical to the operation of the memory according to the first embodiment. However, as described above, in the memory according to the second embodiment, in PHASE2, the memory sequence controller MSCNT decrements the number of charge pumps in the charge-pump-number register PNUMREG by a numerical value corresponding to drive capacities of the charge pumps PUMPj allocated.

For example, when the charge pump PUMP2 is allocated, the memory sequence controller MSCNT decrements by "1" the number of charge pumps in the charge-pump-number register PNUMREG. On the other hand, when the charge pump PUMP0 or PUMP1 is allocated, the memory sequence controller MSCNT decrements by "2" the number of charge pumps in the charge-pump-number register PNUMREG.

More specifically, at t4, when the signal PUMP2SEL is set such that the charge pump PUMP2 generates the voltage Vpass1, the number of charge pumps corresponding to the voltage Vpass1 in the charge-pump-number register PNUMREG is decremented by 1. Accordingly, the charge pump PUMP2 is allocated to generate the voltage Vpass1.

At t5, when the signal PUMP1SEL is set such that the charge pump PUMP1 generates the voltage Vpass2, the number of charge pumps corresponding to Vpass2 in the charge-pump-number register PNUMREG is decremented by 2. This is because the charge pump PUMP1 has a drive capacity two times that of the charge pump PUMP2. Accordingly, the charge pump PUMP1 is allocated to generate the voltage Vpass2.

Other operations of the memory according to the second embodiment can be identical to corresponding operations of the memory according to the first embodiment. Therefore, the second embodiment can also achieve effects identical to those of the first embodiment. Further, in the second embodiment, because the total number of charge pumps is small, there is an effect that a layout area of the charge pumps PUMPj becomes small. Furthermore, in the second embodiment, because the total number of charge pumps is small, there is also an effect that a time (PHASE1) required to allocate the charge pumps PUMPj to each pass voltage is shortened.

In the above embodiments, there are three kinds of pass voltages, which are Vpass1, Vpass2, and Vpass3; however, the kinds of pass voltages can be four or more.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
 a plurality of memory cells;
 a plurality of word lines connected to the memory cells;
 a plurality of charge pumps configured to apply to the word lines any of first to n-th (n is an integer equal to or larger than 2) voltages of which voltage levels are different from each other, when writing data into at least one of the memory cells;
 an application voltage selector configured to select a voltage to be applied to the word lines among the first to n-th voltages;
 a word-line-number register configured to store number of the word lines to which the first to the n-th voltages are applied, the word-line-number register storing the number of the word lines for each of the first to the n-th voltages;
 a storage configured to store a correspondence table showing a corresponding relationship between the number of the word lines for each of the first to the n-th voltages and the number of the charge pumps allocated to the first to the n-th voltages, respectively; and
 a generation voltage selector configured to allocate the charge pumps in order to respectively generate the first to the n-th voltages based on the correspondence table according to the number of the word lines for each of the first to the n-th voltages, wherein
 the charge pumps are configured to generate any of the first to the n-th voltages allocated respectively by the generation voltage selector.

2. The device of claim 1, further comprising:
 a limiter configured to transmit to the generation voltage selector a drive signal which determines a boosting level of the charge pumps at any of the first to n-th voltages; and
 a controller configured to transmit to the generation voltage selector a generation-voltage selection signal which allocates the charge pumps in order to generate the first to the n-th voltages, respectively, wherein
 the generation voltage selector comprises:
 a drive-signal selector configured to transmit the drive signal corresponding to any of the first to the n-th voltages to the charge pumps based on the generation-voltage selection signal; and
 a boosted-voltage transmitter configured to transmit output voltages from the charge pumps to the application voltage selector as any of the first to the n-th voltages based on the generation-voltage selection signal.

3. The device of claim 2, wherein the boosted-voltage transmitter is configured by switches which switch the output voltages from the charge pumps to any of the first to n-th voltages based on the generation-voltage selection signal.

4. The device of claim 1, wherein the controller transmits the generation-voltage selection signal corresponding to each of the charge pumps to the generation voltage selector.

5. The device of claim 2, wherein the controller transmits the generation-voltage selection signal corresponding to each of the charge pumps to the generation voltage selector.

6. The device of claim 1, wherein the device is a NAND type flash memory.

7. The device of claim 2, wherein the device is a NAND type flash memory.

8. The device of claim 3, wherein the device is a NAND type flash memory.

9. The device of claim 4, wherein the device is a NAND type flash memory.

10. The device of claim 1, wherein
drive capacities of the charge pumps are equal to each other, and
the generation voltage selector respectively allocates the charge pumps by a number corresponding to the number of the word lines for each of the first to the n-th voltages, in order to generate the first to the n-th voltages.

11. The device of claim 2, wherein
drive capacities of the charge pumps are equal to each other, and
the generation voltage selector respectively allocates the charge pumps by a number corresponding to the number of the word lines for each of the first to the n-th voltages, in order to generate the first to the n-th voltages.

12. The device of claim 3, wherein
drive capacities of the charge pumps are equal to each other, and
the generation voltage selector respectively allocates the charge pumps by a number corresponding to the number of the word lines for each of the first to the n-th voltages, in order to generate the first to the n-th voltages.

13. The device of claim 1, wherein
drive capacities of the charge pumps are different from each other, and
the generation voltage selector allocates the charge pumps having drive capacities corresponding to the number of the word lines for each of the first to n-th voltages, in order to generate the first to n-th voltages, respectively.

14. The device of claim 2, wherein
drive capacities of the charge pumps are different from each other, and
the generation voltage selector allocates the charge pumps having drive capacities corresponding to the number of the word lines for each of the first to n-th voltages, in order to generate the first to n-th voltages, respectively.

15. The device of claim 3, wherein
drive capacities of the charge pumps are different from each other, and
the generation voltage selector allocates the charge pumps having drive capacities corresponding to the number of the word lines for each of the first to n-th voltages, in order to generate the first to n-th voltages, respectively.

16. The device of claim 1, wherein the n of the n-th voltage is an integer equal or larger than 3.

17. The device of claim 1, wherein the generation voltage selector allocates the charge pumps for each of the first to the n-th voltages in order to generate the first to n-th voltages, respectively, in each write sequence which includes plural write operations and plural verify operations.

* * * * *